United States Patent [19]
Davis

[11] Patent Number: 5,798,716
[45] Date of Patent: Aug. 25, 1998

[54] METHOD AND APPARATUS FOR DETECTING KEY ACTUATIONS

[75] Inventor: Scott Burdell Davis, Buffalo Grove, Ill.

[73] Assignee: Motorola, Inc., Schaumburg, Ill.

[21] Appl. No.: 701,945

[22] Filed: Aug. 23, 1996

[51] Int. Cl.$^6$ .................................................. H03K 17/94
[52] U.S. Cl. ........................ 341/26; 341/22; 340/825.79; 379/368
[58] Field of Search .............................. 341/22, 26, 23; 364/709.04; 379/368; 340/825.79

[56] References Cited

U.S. PATENT DOCUMENTS

| | | | |
|---|---|---|---|
| 4,064,399 | 12/1977 | Muranaka | 364/709.04 |
| 4,532,497 | 7/1985 | Danish | 341/22 |
| 5,070,330 | 12/1991 | Wu | 341/26 |
| 5,266,950 | 11/1993 | Gulick et al. | 341/22 |
| 5,512,893 | 4/1996 | Gulick | 341/26 |
| 5,534,860 | 7/1996 | Phillips et al. | 341/22 |

OTHER PUBLICATIONS

Gardner et al., U.S.S.N. 08/685,122, "Method and Apparatus for Detecting Key Actuations", Attorney Docket No. CE01382R, filed Jul. 23, 1996.

Primary Examiner—Brian Zimmerman
Assistant Examiner—Albert K. Wong
Attorney, Agent, or Firm—John J. Oskorep

[57] ABSTRACT

An electronic device (100) comprises a first plurality of keys (117), a second plurality of keys (119), and a processor (506) having a plurality of inputs (600) and an output (620). The output (620) is utilized to bias the plurality of inputs (600) at a first predetermined voltage during a first predetermined time period and at a second predetermined voltage during a second predetermined time period. An actuation of any one of the first plurality of keys (117) couples a unique combination of two inputs of the plurality of inputs (600) to the second predetermined voltage, and an actuation of any one of the second plurality of keys (119) couples a unique combination of two inputs of the plurality of inputs (600) to the first predetermined voltage. Thus, the processor (506) can detect actuations of the first plurality of keys (117) during the first predetermined time period and the second plurality of keys (119) during the second predetermined time period.

18 Claims, 7 Drawing Sheets

| INPUTS | | | | | | | OUTPUT | KEY PRESSED |
|---|---|---|---|---|---|---|---|---|
| COLUMN | | | ROW | | | | | |
| I1 | I2 | I3 | I4 | I5 | I6 | I7 | O1 | |
| 1 | 1 | 1 | 1 | 1 | 1 | 1 | 1 | NONE |
| 0 | 1 | 1 | 0 | 1 | 1 | 1 | 1 | 1 |
| 0 | 1 | 1 | 1 | 0 | 1 | 1 | 1 | 4 |
| 0 | 1 | 1 | 1 | 1 | 0 | 1 | 1 | 7 |
| 0 | 1 | 1 | 1 | 1 | 1 | 0 | 1 | * |
| 1 | 0 | 1 | 0 | 1 | 1 | 1 | 1 | 2 |
| 1 | 0 | 1 | 1 | 0 | 1 | 1 | 1 | 5 |
| 1 | 0 | 1 | 1 | 1 | 0 | 1 | 1 | 8 |
| 1 | 0 | 1 | 1 | 1 | 1 | 0 | 1 | 0 |
| 1 | 1 | 0 | 0 | 1 | 1 | 1 | 1 | 3 |
| 1 | 1 | 0 | 1 | 0 | 1 | 1 | 1 | 6 |
| 1 | 1 | 0 | 1 | 1 | 0 | 1 | 1 | 9 |
| 1 | 1 | 0 | 1 | 1 | 1 | 0 | 1 | # |
| 0 | 0 | 0 | 0 | 0 | 0 | 0 | 0 | NONE |
| 1 | 0 | 0 | 1 | 0 | 0 | 0 | 0 | C |
| 1 | 0 | 0 | 0 | 1 | 0 | 0 | 0 | ✉ |
| 1 | 0 | 0 | 0 | 0 | 1 | 0 | 0 | ◀ |
| 1 | 0 | 0 | 0 | 0 | 0 | 1 | 0 | MR |
| 0 | 1 | 0 | 1 | 0 | 0 | 0 | 0 | OK |
| 0 | 1 | 0 | 0 | 1 | 0 | 0 | 0 | 🔊 |
| 0 | 1 | 0 | 0 | 0 | 1 | 0 | 0 | ▶ |
| 0 | 1 | 0 | 0 | 0 | 0 | 1 | 0 | M+ |
| 0 | 0 | 1 | 1 | 0 | 0 | 0 | 0 | 1st UNUSED |
| 0 | 0 | 1 | 0 | 1 | 0 | 0 | 0 | 2nd UNUSED |
| 0 | 0 | 1 | 0 | 0 | 1 | 0 | 0 | 3rd UNUSED |
| 0 | 0 | 1 | 0 | 0 | 0 | 1 | 0 | 4th UNUSED |

METHOD AND APPARATUS FOR DETECTING KEY ACTUATIONS

FIELD OF THE INVENTION

The present invention relates generally to the field of detecting key actuations, and more particularly to detecting key actuations from a keypad of a communication device.

BACKGROUND OF THE INVENTION

An electronic device typically includes a keypad having a plurality of keys for operating the electronic device. A processor of the electronic device typically detects user actuations of these keys and processes them accordingly. Unfortunately, of course, the processor has only a limited number of inputs which can be used for such tasks. Therefore, it is advantageous to minimize the number of inputs required by the processor for detecting actuations of the plurality of keys.

Conventional methods have somewhat reduced the number of inputs needed for detecting key actuations. One such method is a matrix method, where each key depression toggles a voltage of a unique row and column input to a processor. Given seven inputs to a processor, for example, where four of the inputs are designated as row inputs and three of the inputs are designated as column inputs, twelve keys may be uniquely distinguished and detected (4×3=12). Another conventional key detection method is a scanning method, where each column of a matrix of keys is selected sequentially by outputs of a processor for respective sequential detection by inputs to the processor. None of these conventional methods, however, have greatly increased the number of keys which can be uniquely detected given a number of processor inputs and outputs.

DETAILED DESCRIPTION OF THE PREFERRED EMBODIMENTS

According to the present invention, an electronic device comprises a first plurality of keys, a second plurality of keys, and a processor having a plurality of inputs and an output. The output biases the plurality of inputs at a first predetermined voltage during a first predetermined time period and at a second predetermined voltage during a second predetermined time period. An actuation of each key of the first plurality of keys couples a unique combination of two inputs of the plurality of inputs to the second predetermined voltage, and an actuation of each key of the second plurality of keys couples a unique combination of two inputs of the plurality of inputs to the first predetermined voltage. Thus, the processor can detect actuations of the first plurality of keys during the first predetermined time period and the second plurality of keys during the second predetermined time period.

Figure 1:
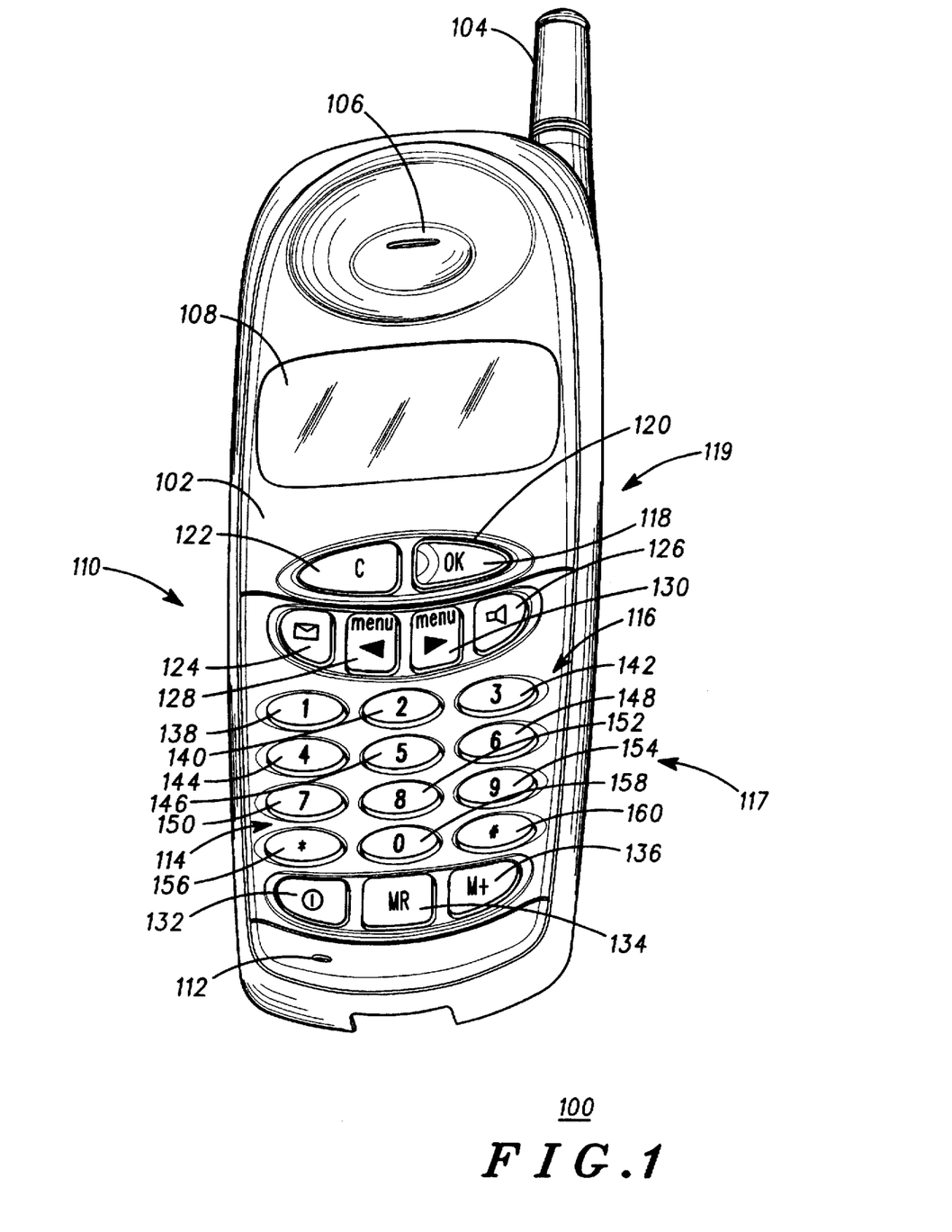
FIG. 1 is an illustration showing an electronic device which may embody the present invention.

FIG. 1 shows an electronic device 100 which may include the present invention. Electronic device 100 of FIG. 1 is a communication device and, more particularly, a radiotelephone used for telephone communications. Electronic device 100 may be more commonly referred to as a cellular telephone. Electronic device 100 comprises a housing 102, an antenna 104, a speaker 106, a display 108, a keypad 110, and a microphone 112. Keypad 110 is disposed within housing 102 and includes a plurality of keys 114.

Figure 5:
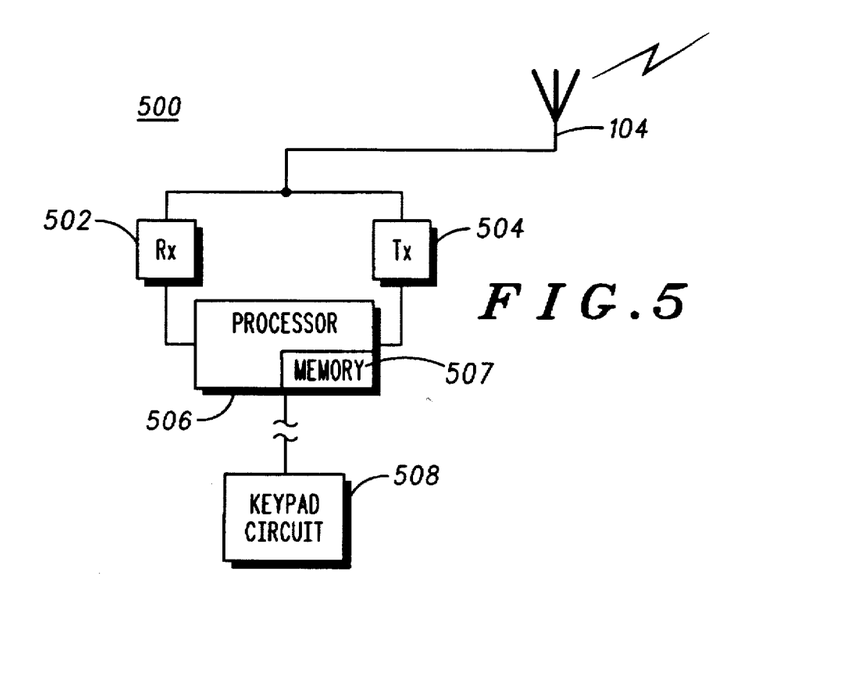
FIG. 5 is a schematic diagram of electronic circuitry which operates the electronic device of FIG. 1.

Electronic device 100 includes electronic circuitry 500, shown in FIG. 5, disposed within housing 102. Electronic circuitry 500 is provided for processing functions within electronic device 100, functions primarily associated with telephone communications. Electronic circuitry 500 includes a receiver 502, a transmitter 504, a processor 506, and a keypad circuit 508. With receiver 502 and transmitter 504, electronic device 100 receives and transmits, respectively, radio frequency (RF) signals through antenna 104. Microphone 112 and speaker 106 (FIG. 1) are coupled to electronic circuitry 500 and are used for talking and listening, respectively, during telephone communications. Processor 506 controls many functions of electronic device 100, including the operations of receiver 502 and transmitter 504. Processor 506 includes a memory 507 for storing data and instructions. Processor 506 receives and processes input signals from keypad circuit 508, input signals which are generated in response to user inputs from keypad 110 (FIG. 1).

Referring back to FIG. 1, the plurality of keys 114 includes DTMF keys 117 (a first plurality of keys) and function keys 119 (a second plurality of keys). The plurality of keys 114 are used to control functions of electronic device 100 and to enter telephone numbers for placing telephone calls. Telephone numbers are entered using DTMF keys 117, which include a one key 138, a two key 140, a three key 142, a four key 144, a five key 146, a six key 148, a seven key 150, an eight key 152, a nine key 154, a zero key 158, an asterisk key 156, and a pound key 160. When one of DTMF keys 117 is depressed, a corresponding alphanumeric character is displayed on display 108 and a corresponding dual-tone multiple frequency (DTMF) audio signal may be heard from speaker 106.

Function keys 119 include an OK key 118, a C key 122, a voicemail key 124, a volume key 126, a left arrow key 128, a right arrow key 130, an on/off key 132, a memory recall key 134, and a memory store key 136. A user operates OK key 118 and C key 122 in response to questions which are displayed on display 108, where OK key 118 generally provides a "yes" response and C key 122 generally provides a "no" response. For example, display 108 may display "SEND CALL?" after a user has entered a telephone number using DTMF keys 117. In response to this question, a user may press OK key 118 to connect the telephone call or, alternatively, the user may press C key 122 to clear the telephone number from display 108 and thus cancel the telephone call.

Each key of function keys 119 corresponds to some predetermined function for controlling or operating electronic device 100. Electronic device 100 may be turned on and off using on/off key 132. Voicemail key 124 may be used to access voicemail messages left for the user of electronic device 100. Left arrow key 128 and right arrow key 130 may be used to scroll though menus of features and options of electronic device 100. Volume key 126 may be used to raise and lower the volume of the audio from speaker 106. Memory store key 136 may be used to store a telephone number into memory 507 of electronic device 100, and memory recall key 134 may be used to recall a telephone number from memory 507. Of course, the plurality of keys 114 might include more commonly named cellular telephone keys, such as "SEND" and "END" keys, which have been traditionally provided for connecting and disconnecting telephone calls, respectively.

Figure 2:
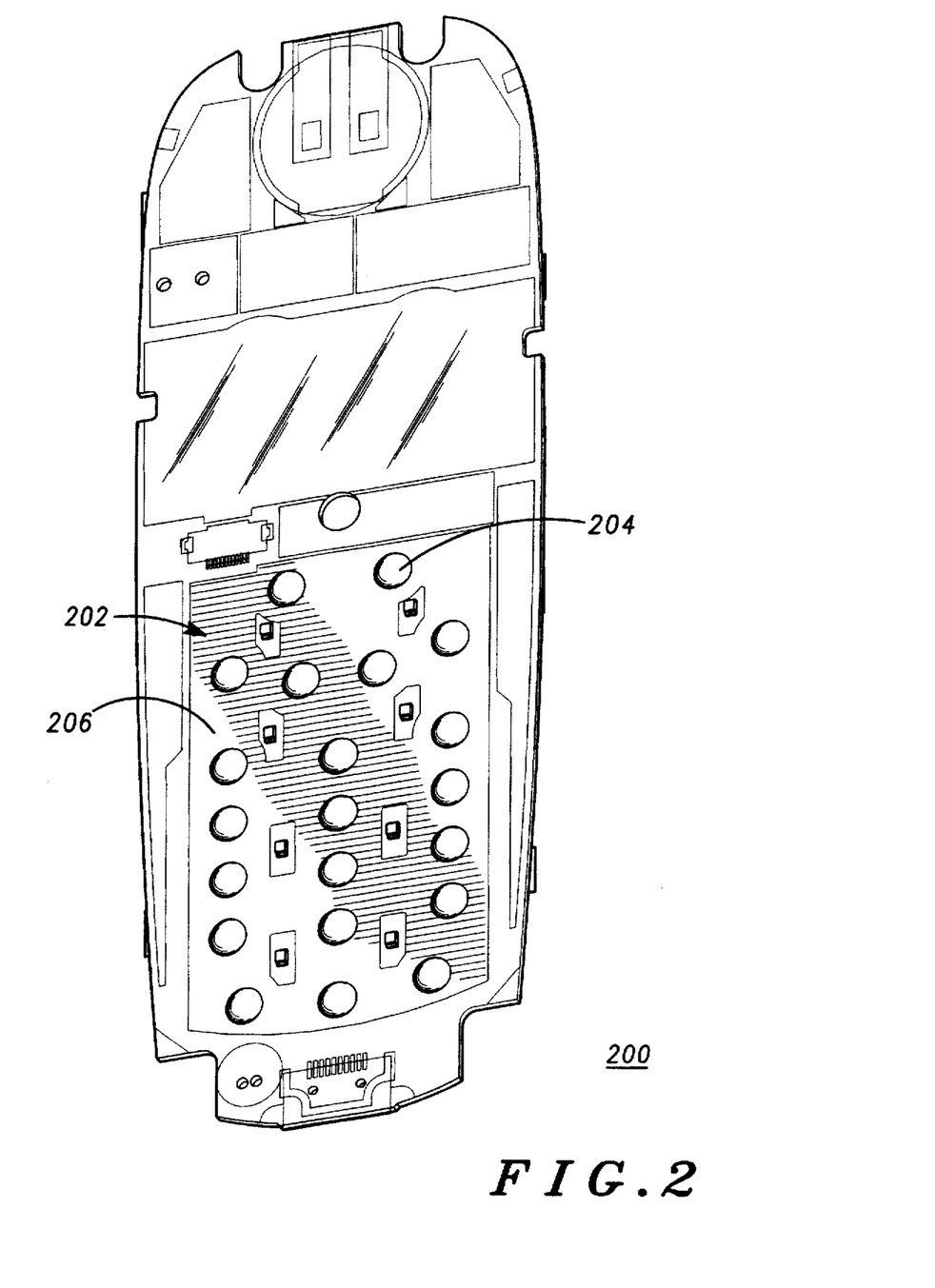
FIG. 2 is an illustration showing a printed circuit board (PCB) which is disposed within the electronic device of FIG. 1.

FIG. 2 shows a printed circuit board (PCB) 200 which is disposed within housing 102 when electronic device 100 is fully assembled. PCB 200 includes a plurality of contact regions 202, including a contact region 204. PCB 200 includes a contact sheet 206, preferably MYLAR™, adhesively attached to the surface of PCB 200.

Referring back to FIG. 1, keypad 110 is a rectangularly formed body which is typically manufactured from a flexible material, preferably rubber. The plurality of keys 114 are integrally defined from keypad 110. Housing 102 defines a plurality of holes 116, including a hole 120. When electronic device 100 is fully assembled, keypad 110 is sandwiched between housing 102 and PCB 200 (FIG. 2) such that each one of the plurality of keys 114 inserts and slightly protrudes through one of the plurality of holes 116. Each one of the plurality of keys 114 corresponds to one of the plurality of contact regions 202 for making contact thereto. For example, OK key 118 is disposed through hole 120 and corresponds to contact region 204. When depressed by a user, a portion of OK key 118 makes physical contact with contact region 204.

Figure 3:
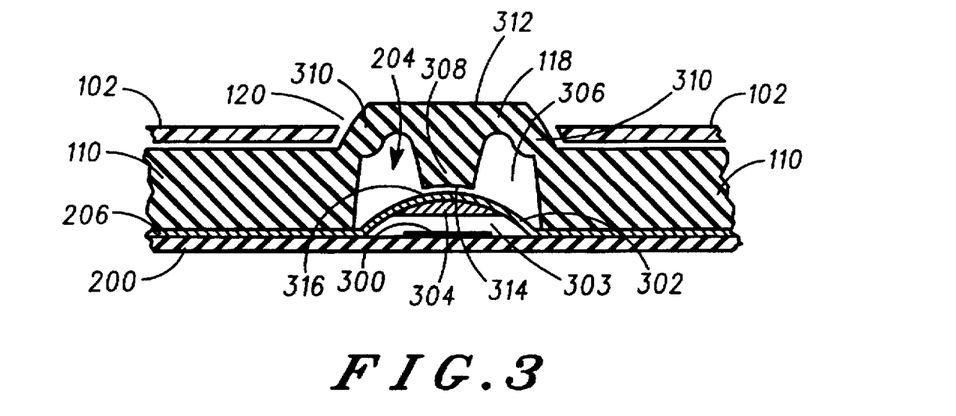
FIG. 3 is an illustration showing a cross-sectional side view of the electronic device of FIG. 1, the view including a portion of a keypad of the electronic device and a portion of the PCB of FIG. 2.

Providing more detail for such key actuations, FIG. 3 shows a cross-sectional side view of a portion of electronic device 100. This view includes a portion of PCB 200, a portion of contact sheet 206, and a portion of keypad 110 and OK key 118. Contact region 204 includes a conductive pad region 300 of PCB 200, a dome portion 302 defined from contact sheet 206, and a shorting pad 304 attached to the inside of dome portion 302. Contact sheet 206 and PCB 200 define a gap 303 formed from dome portion 302. Shorting pad 304 is made from an electrically conductive material, preferably silver. Keypad 110 integrally defines OK key 118 and a gap 306. OK key 118 includes a contact portion 308, a thinned portion 310, and a top portion 312. Top portion 312 slightly protrudes through hole 120.

When top portion 312 is pressed in a direction towards contact region 204, thinned portion 310 flexes easily to allow OK key 118 to move in a direction towards dome portion 302 and conductive pad region 300. A bottom surface 314 of contact portion 308 eventually makes contact with a top surface 316 of dome portion 302 when OK key 118 is further pressed. Since contact sheet 206 is made from a thin and flexible material, dome portion 302 bends inwardly such that shorting pad 304 makes physical and electrical contact with conductive pad region 300. When OK key 118 is released, shorting pad 304 loses contact with conductive pad region 300 and, thereafter, dome portion 302 and OK key 118 spring back into the position as shown in FIG. 3. Thus, keypad 110 and PCB 200 provide a plurality of momentary switches for a user of electronic device 100.

Figure 4:
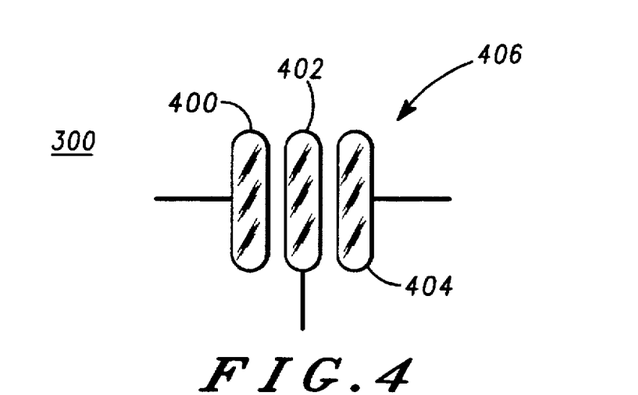
FIG. 4 is an illustration showing a conductive pad region of the PCB.

FIG. 4 shows a top view of conductive pad region 300. Conductive pad region 300 includes a plurality of conductive pads 406 which are electrically conductive. In the embodiment of FIG. 4, the plurality of conductive pads 406 includes a conductive pad 400, a conductive pad 402, and a conductive pad 404. Although not shown in FIG. 4, each of the plurality of conductive pads 406 is electrically coupled to other elements of keypad circuit 508, as described in detail below, via electrical traces or conductors of PCB 200. When shorting pad 304 makes physical contact with conductive pad region 300 from a depression of OK key 118, shorting pad 304 electrically couples conductive pads 400, 402, and 404 together. Shorting pad 304 has an area which is sized to cover a substantial portion of conductive pad region 300.

Each of the plurality of keys 114 of FIG. 1 and each of the plurality of contact regions 202 of FIG. 2 have a construction similar to that of OK key 118 and contact region 204, respectively, as described and shown in FIG. 3. In addition, each of the plurality of contact regions 202 includes a plurality of conductive pads similarly shaped and arranged as the plurality of conductive pads 406 of FIG. 4. Of course, any apparatus providing contact in response to key actuations may be used. For example, a more conventional apparatus may be used where contact sheet 206 is excluded from the design and shorting pad 304 is attached directly to bottom surface 314 of OK key 118.

Figure 6:
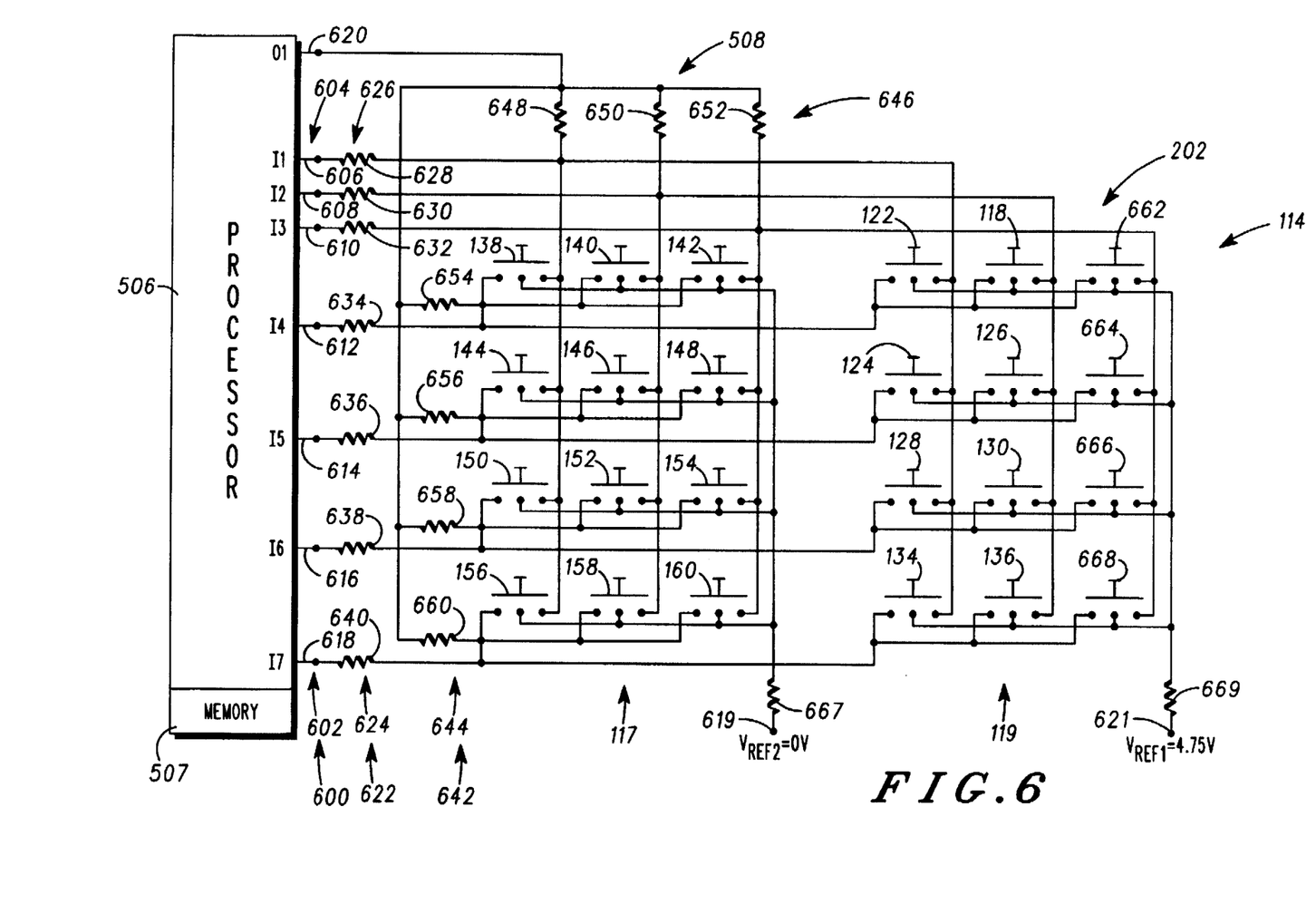
FIG. 6 is a schematic diagram showing a keypad circuit and a processor in accordance with the present invention.

FIG. 6 is a schematic diagram showing keypad circuit 508 and processor 506 in accordance with the present invention. (Note that on/off key 132 is not referred to in FIG. 6 since it is not detected in the manner described herein.) Processor 506 has a plurality of inputs 600. The plurality of inputs 600 includes a plurality of row inputs 602 and a plurality of column inputs 604. The plurality of column inputs 604 includes an input 606, an input 608, and an input 610. The plurality of row inputs 602 includes an input 612, an input 614, an input 616, and an input 618. In FIG. 6, inputs 606, 608, 610, 612, 614, 616, and 618 are designated I1, I2, I3, I4, I5, I6, and I7, respectively. In this embodiment, each of the plurality of inputs 600 are digital logic inputs, that is, only one of two voltage-based states is recognizable by processor 506 ('0' for a low voltage or '1' for a high voltage). Processor 506 includes a software program which periodically reads and processes the plurality of inputs 600 described in detail below. Processor 506 also includes an output 620, a digital logic output capable of being set at one of two voltages by means of the software program.

Keypad circuit 508 includes the plurality of contact regions 202, a plurality of resistors 622, a plurality of resistors 642, a resistor 667, and a resistor 669. The plurality of resistors 622, which includes a plurality of row resistors 624 and a plurality of column resistors 626, are optional and provided for protection of the plurality of inputs 600 from electrostatic discharge (ESD). The plurality of column resistors 626 includes a resistor 628, a resistor 630, and a resistor 632. Resistors 628, 630, and 632 each have a first end coupled to inputs 606, 608, and 610, respectively. The plurality of row resistors 624 includes a resistor 634, a resistor 636, a resistor 638, and a resistor 640. Resistors 634, 636, 638, and 640 each have a first end coupled to inputs 612, 614, 616, and 618, respectively. The plurality of resistors 642 includes a plurality of resistors 644 and a plurality of resistors 646. The plurality of resistors 644 includes a resistor 654, a resistor 656, a resistor 658, and a resistor 660. The plurality of resistors 646 includes a resistor 648, a resistor 650, and a resistor 652.

Each contact region of the plurality of contact regions 202 includes a first conductive pad, a second conductive pad, and a third conductive pad. Each contact region corresponding to one of function keys 119 has a first conductive pad coupled to a node 621 through resistor 669, where node 621 is biased at a first predetermined voltage. Each contact region corresponding to one of DTMF keys 117 has a first conductive pad coupled to a node 619 through resistor 667, where node 619 is biased at a second predetermined voltage. In the preferred embodiment, the first predetermined voltage is about 4.75-volts and the second predetermined voltage is about 0-volts. Also, each resistor of the plurality of resistors 622 is 10K ohms, each resistor of the plurality of resistors 642 is 100K ohms, resistor 667 is 1K ohm, and resistor 669 is 1K ohm. Of course, other suitable voltage and resistance values may be used.

Each second conductive pad corresponding to one key 138, two key 140, and three key 142 is coupled to input 612 ("row one" input) through resistor 634 and to output 620 through resistor 654. Each second conductive pad corresponding to four key 144, five key 146, and six key 148 is coupled to input 614 ("row two" input) through resistor 636 and to output 620 through resistor 656. Each second conductive pad corresponding to seven key 150, eight key 152, and nine key 154 is coupled to input 616 ("row three" input) through resistor 638 and to output 620 through resistor 658. Each second conductive pad corresponding to asterisk key 156, zero key 158, and pound key 160 is coupled to input 618 ("row four" input) through resistor 640 and to output 620 through resistor 660.

Each third conductive pad corresponding to one key 138, four key 144, seven key 150, and asterisk key 156 is coupled to input 606 ("column one" input) through resistor 628 and to output 620 through resistor 648. Each third conductive pad corresponding to two key 140, five key 146, eight key 152, and zero key 158 is coupled to input 608 ("column two" input) through resistor 630 and to output 620 through resistor 650. Each third conductive pad corresponding to three key 142, six key 148, nine key 154, and pound key 160 is coupled to input 610 ("column three" input) through resistor 632 and to output 620 through resistor 652.

The conductive pads corresponding to functions keys 119 are coupled to processor 506 in a manner similar to the conductive pads corresponding to DTMF keys 117. Each second conductive pad corresponding to C key 122, OK key 118, and a first unused key 662 is coupled to input 612 ("row one" input) through resistor 634 and to output 620 through resistor 654. Each second conductive pad corresponding to voicemail key 124, volume key 126, and a second unused key 664 is coupled to input 614 ("row two" input) through resistor 636 and to output 620 through resistor 656. Each second conductive pad corresponding to left arrow key 128, right arrow key 130, and a third unused key 666 is coupled to input 616 ("row three" input) through resistor 638 and to output 620 through resistor 658. Each second conductive pad corresponding to memory recall key 134, memory store key 136, and fourth unused key 668 is coupled to input 618 ("row four" input) through resistor 640 and to output 620 through resistor 660.

Each third conductive pad corresponding to C key 122, voicemail key 124, left arrow key 128, and memory recall key 134 is coupled to input 606 ("column one" input) through resistor 628 and to output 620 through resistor 648. Each third conductive pad corresponding to OK key 118, volume key 126, right arrow key 130, and memory store key 136 is coupled to input 608 ("column two" input) through resistor 630 and to output 620 through resistor 650. Each third conductive pad corresponding to first unused key 662, second unused key 664, third unused key 666, and fourth unused key 668 is coupled to input 610 ("column three" input) through resistor 632 and to output 620 through resistor 652.

When output 620 is set at 4.75-volts and one of DTMF keys 117 is depressed, a unique combination of two inputs of the plurality of inputs 600 is toggled from high to low. For example, when one key 138 is depressed, inputs 606 and 612 are toggled from 4.75-volts to 0-volts. Alternatively, when output 620 is set at 0-volts and one of function keys 119 is depressed, a unique combination of two inputs of the plurality of inputs 600 is toggled from low to high. For example, when C key 122 is depressed, inputs 606 and 612 are toggled from 0-volts to 4.75-volts. When output 620 is set at 4.75-volts, no substantial change in voltage is detectable at processor 506 due to actuations of any of function keys 119. Likewise, when output 620 is set at 0-volts, no substantial change in voltage is detectable at processor 506 due to actuations of any of DTMF keys 117.

Figure 7:
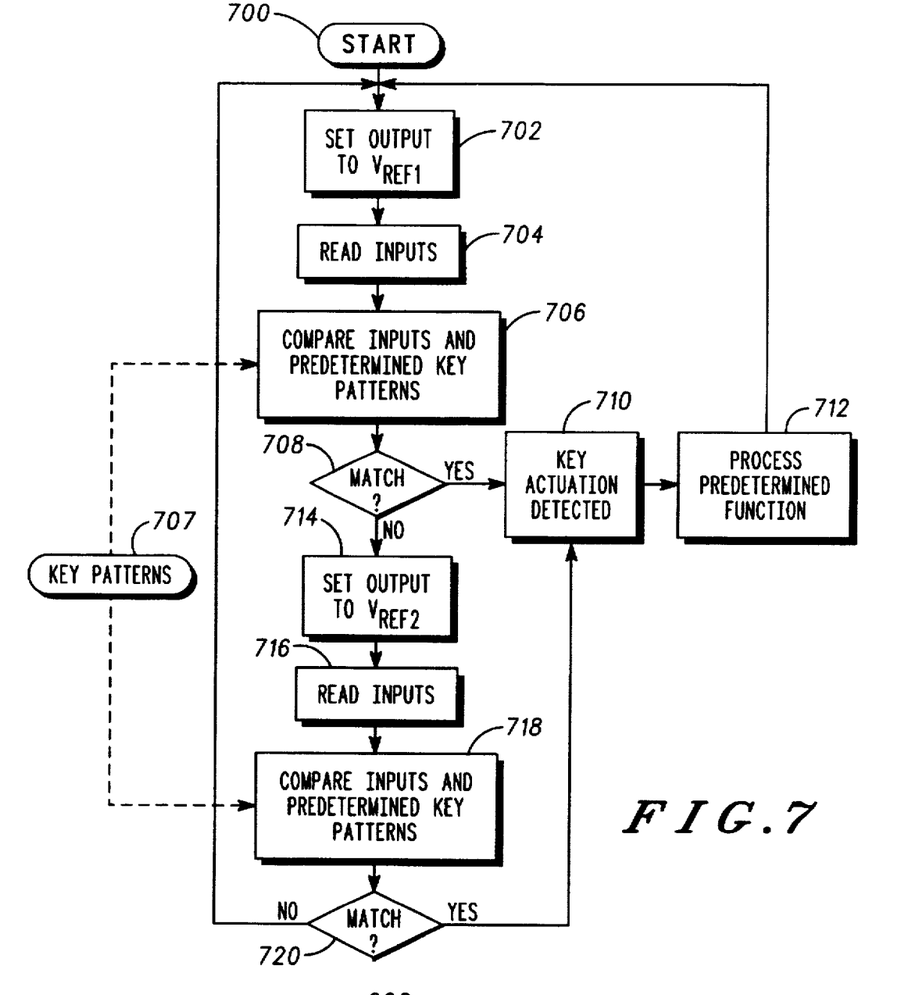
FIG. 7 shows a method describing the operation of the processor of FIG. 6.
Figure 8:
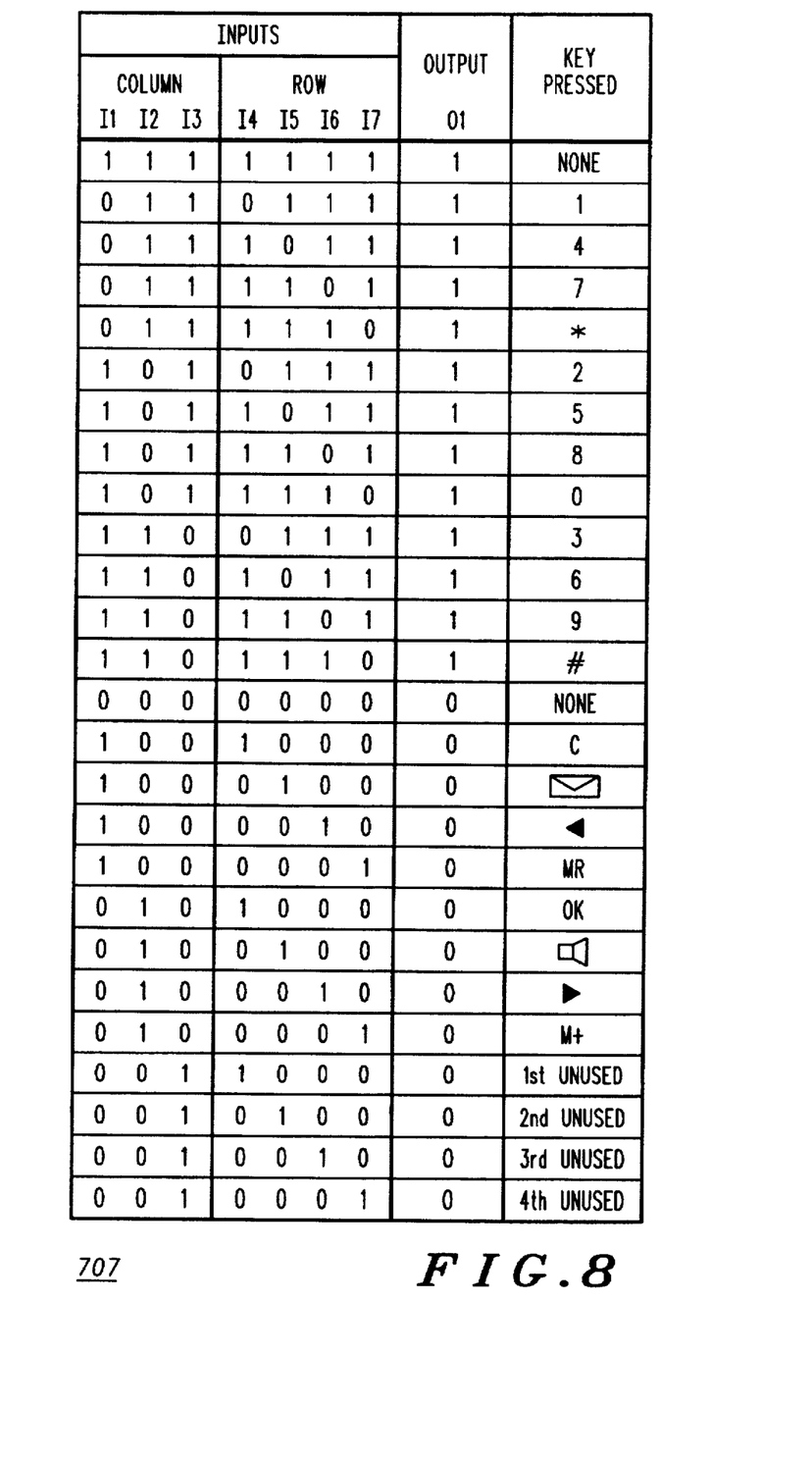
FIG. 8 is a table showing a set of predetermined key patterns for the embodiment shown in FIG. 6.

FIG. 7 shows a method which describes the operation of processor 506 of FIG. 6. A block 700 shows a starting position. At step 702, processor 506 sets or biases output 620 to the first predetermined voltage (4.75-volts). At step 704, the plurality of inputs 600 are read by processor 506. At step 706, the plurality of inputs 600 are compared to a set of predetermined key patterns 707, where each key pattern corresponds to a particular key press. The set of predetermined key patterns 707 for this embodiment is shown in the table of FIG. 8. Data corresponding to the table of FIG. 8 are stored in memory 507 (FIG. 6). If a match is made between one of the set of predetermined key patterns 707 and the plurality of inputs 600, as tested at step 708, a key actuation is detected at step 710. At step 712, a predetermined function corresponding to the key actuation is processed.

If a match does not exist between one of the set of predetermined key patterns 707 and the plurality of inputs 600 at step 708, processor 506 sets output 620 to the second predetermined voltage (0-volts) at step 714. At step 716, the plurality of inputs 600 are read by processor 506. At step 718, the plurality of inputs 600 are compared to the set of predetermined key patterns 707. If a match exists between one of the set of predetermined key patterns 707 and the plurality of inputs 600, as tested at step 720, a key actuation is detected at step 710 and a predetermined function corresponding to the key actuation is processed at step 712. Thereafter, the process is repeated at step 702 where processor 506 reads the plurality of inputs 600 again. If there is no match between the plurality of inputs 600 and the set of predetermined key patterns 707 at step 720, the process is likewise repeated at step 702. During this continuous key detection, of course, output 620 is generating a periodic high-low output signal.

Suppose, for example, five key 146 of DTMF keys 117 is depressed by a user. Processor 506 sets output 620 to 4.75-volts (step 702). Processor 506 then reads '1011011' from the plurality of inputs 600 (step 704). Processor 506 then compares '1011011' to the set of predetermined key patterns 707 of FIG. 8 (step 706). A match is detected between '1011011' and one of the set of predetermined key patterns 707 (step 708), and a key actuation is detected (step 710). In response thereto, the numeric character "5" is displayed on display 108 and a corresponding DTMF signal is heard from speaker 106 (step 712).

Suppose, on the other hand, that volume key 126 of function keys 119 is depressed by the user. Processor 506 sets output 620 to 4.75-volts (step 702). Processor 506 reads '1111111' from the plurality of inputs 600 (step 704). (Since node 621 is biased at 4.75-volts, no "detectable" voltage toggling occurs from the actuation of volume key 126.) Processor 506 compares '1111111' to the set of predetermined key patterns 707 (step 706), and a match is not detected (step 708). Processor 506 then sets output 620 to 0-volts (step 714). Processor reads '0100100' from the plurality of inputs 600 (step 716). Processor 506 compares '0100100' and the set of predetermined key patterns 707 (step 718). A match is made (step 720) and, therefore, an actuation of volume key 126 is detected (step 710). A predetermined function which increases the volume of the audio from speaker 106 is processed (step 712).

Thus, during a predetermined time period when output 620 is set to the first predetermined voltage, processor 506 is capable of detecting key actuations from DTMF keys 117. Similarly, during a predetermined time period when output 620 is set to the second predetermined voltage, processor 506 is capable of detecting key actuations from function keys 119. Utilizing output 620 in accordance with the present invention, then, the plurality of inputs 600 used to detect DTMF keys 117 during a first predetermined time period are reused to detect function keys 119 during a second predetermined time period. Thus, the number of possible detectable keys is doubled by utilizing output 620 in the manner described herein. Alternatively, of course, the number of inputs required may be comparatively reduced for detecting any desired number of keys. For example, according to conventional matrix methods, twelve keys may be detected given seven inputs; according to the present invention, the same twelve keys may be detected given five inputs and one output.

According to the present invention, the unique combinations of inputs which are toggled in response to key actuations are not limited to matrix method row and column combinations as described above. The unique combinations may include combinations taken from all possible combinations of the inputs. Here, L=M!/[N!(M-N)!], where L is the maximum number of detectable keys, M is the number of processor inputs, and N is the number of inputs toggled per key actuation. For example, toggling voltages at unique combinations of two of seven inputs to a processor results in a maximum of twenty-one possible unique combinations, and thus results in a maximum of twenty-one distinguishable keys. Using such combinations in accordance with the present invention, the maximum number of detectable keys utilizing seven inputs and one output can be doubled from twenty-one keys to forty-two keys.

Of course, processor 506 may read and process key actuations in many different ways. Processor 506 may provide switch debouncing by reading and comparing the plurality of inputs 600 a number of times before making any decisions. Switch debouncing may be necessary because voltages of the plurality of inputs 600 may be unstable when keys are actuated. In addition, processor 506 may read the plurality of inputs 600 periodically, or perhaps in response to a change in voltage detected at one or more of the plurality of inputs 600. Processor 506 may process a predetermined function at a time when a key is pressed, released, or pressed and held for an extended period of time. Regarding keypad circuit 508, the present invention is not limited to, for example, toggling the plurality of inputs 600. For example, a key actuation may provide a quick pulse to a unique combination of the plurality of inputs 600, where processor 506 reads and processes the quick pulses accordingly.

In the preferred embodiment, resistors 667 and 669 each have different resistance values. If resistors 667 and 669 have the same resistance values, a simultaneous actuation of one of DTMF keys 117 and one of function keys 119 which share the same row or column input results in an undefined logic voltage at processor 506. Providing different resistance values (for example, resistors 667 and 669 having resistance values of 1K ohm and 10K ohm, respectively) results in defined logic voltages at processor 506 upon such simultaneous actuations. Therefore, a detection preference is established for either DTMF keys 117 or function keys 119.

Figure 9:
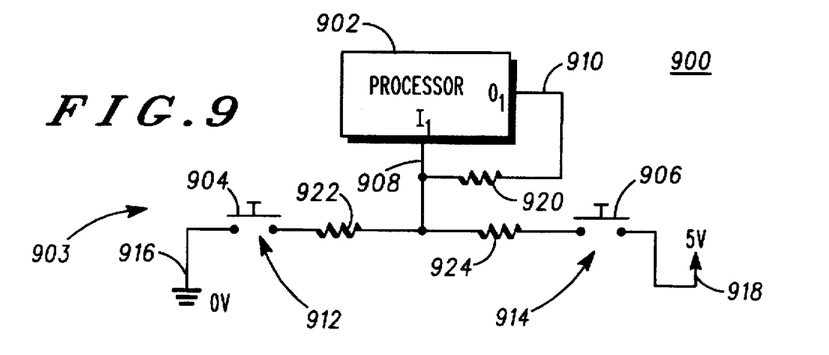
FIG. 9 is an alternate embodiment of a keypad apparatus in accordance with the present invention.

FIG. 9 shows an alternate embodiment of a keypad apparatus 900 in accordance with the present invention. Keypad apparatus 900 includes a processor 902 and at least two keys 903. The at least two keys 903 include a first key 904 and a second key 906. Processor 902 includes at least one input 908 (a digital logic input) and an output 910. Output 910 is coupled to and biases the at least one input 908 through a resistor 920. First key 904 corresponds to a plurality of conductive pads 912 and second key 906 corresponds to a plurality of conductive pads 914. One of the plurality of conductive pads 914 is coupled to a first predetermined voltage 918 and the other of the plurality of conductive pads 914 is coupled to the at least one input 908 through a resistor 924. One of the plurality of conductive pads 912 is coupled to a second predetermined voltage 916 and the other of the plurality of conductive pads 912 is coupled to the at least one input 908 through a resistor 922.

To detect any actuation of first key 904, processor 902 sets output 910 high (at the first predetermined voltage) for a first predetermined time period. During this period, if first key 904 is not pressed, the at least one input 908 is biased high. However, if first key 904 is pressed when output 910 is set high, the at least one input 908 will be low. Of course, any actuation of first key 904 which occurs during the first predetermined time period toggles the at least one input 908 from high to low. Thus, this voltage state (0-volts) or voltage transition (5-volts to 0-volts) is detectable by processor 902 during the first predetermined time period.

To detect any actuation of second key 906, processor 902 sets output 910 low (at the second predetermined voltage) for a second predetermined time period. During this predetermined time period, if second key 906 is not pressed, the at least one input 908 is biased low.

However, if second key 906 is pressed when output 910 is set low, the at least one input 908 will be high. Of course, any actuation of second key 906 which occurs during the second predetermined time period toggles the at least one input 908 from low to high. Thus, this voltage state (5-volts) or voltage transition (0-volts to 5-volts) is detectable by processor 902 during the second predetermined time period.

Processor 902 repeats these steps for detecting first key 904 and second key 906 for continuous key detection. Of course, during the first predetermined time period, no change in voltage is detectable upon a sole actuation of second key 906. Likewise, during the second predetermined time period, no change in voltage is detectable upon a sole actuation of first key 904. If first key 904 and second key 906 are simultaneously pressed and resistors 922 and 924 have the same resistance values, the at least one input 908 may be undesirably biased at an undefined voltage. To avoid this problem, resistors 922 and 924 preferably have different resistance values so that one of the at least two keys 903 is consistently detected upon a simultaneous actuation.

Thus, according to the embodiment of FIG. 9, two keys may be detected given one input and an output. Of course, then, four keys may be detected given two inputs and an output, six keys may be detected given three inputs and an output, and so on. It should also be realized that the signal at output 910, for example, can be derived from a source other than processor 902. For example, the signal may be derived from a digital clock source of an electronic device which includes keypad apparatus 900.

Figure 10:
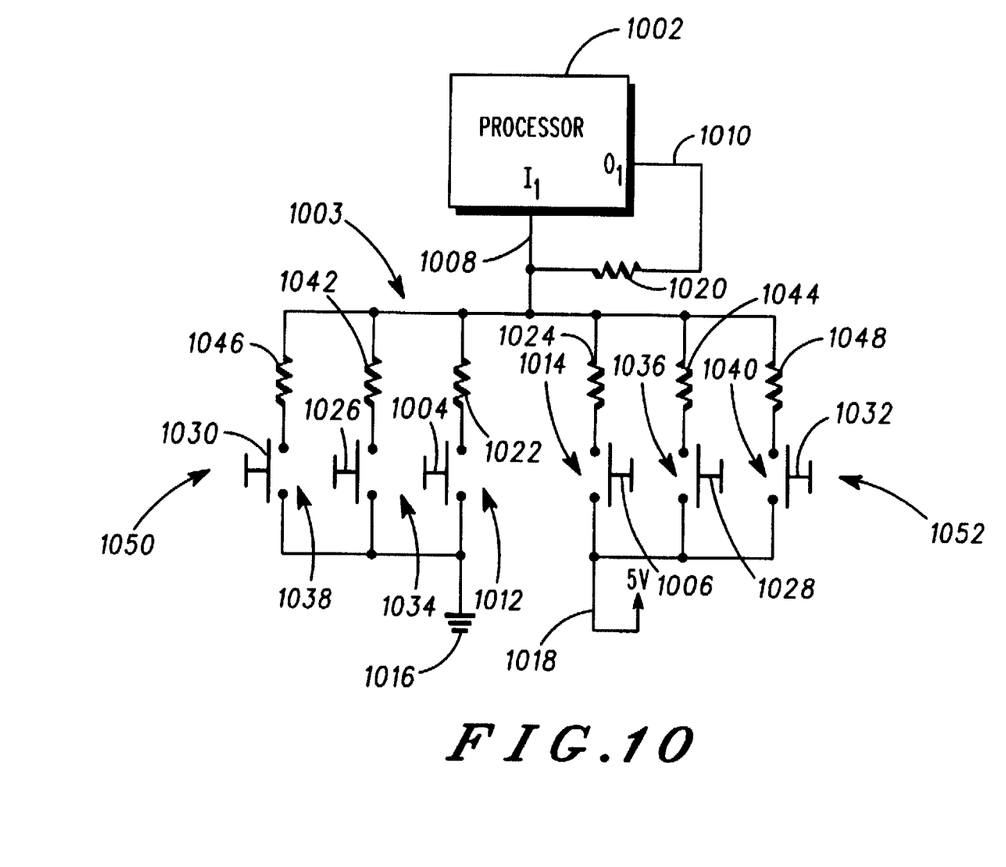
FIG. 10 shows another alternate embodiment of a keypad apparatus in accordance with the present invention.

Other conventional keypad detection schemes may also be modified in accordance with the present invention. For example, one conventional detection scheme utilizes a resistor ladder network coupled to an analog to digital (A/D) input of a processor. When each key of a plurality of keys is depressed, a unique voltage appears at the A/D input for detection. A modification of this conventional detection scheme is shown in FIG. 10, where actuations of a plurality of keys 1003 are detectable. A processor 1002 includes at least one input 1008, which is an A/D input, and an output 1010. Output 1010 is coupled to the at least one input 1008 through a resistor 1020. A first resistor ladder network 1050 and a second resistor ladder network 1052 are coupled to the at least one input 1008. First resistor ladder network 1050 includes a resistor 1022, a resistor 1042, and a resistor 1046, and second resistor ladder network 1052 includes a resistor 1024, a resistor 1044, and a resistor 1048. Typically, resistors 1022, 1042, and 1046 each have different resistor values, as do resistors 1024, 1044, and 1048. First resistor ladder network 1050 is provided for detection of a first key 1004 (corresponding to a plurality of conductive pads 1012), a second key 1026 (corresponding to a plurality of conductive pads 1034), and a third key 1030 (corresponding to a plurality of conductive pads 1038). Second resistor ladder network 1052 is provided for detection of a fourth key 1006 (corresponding to a plurality of conductive pads 1014), a fifth key 1028 (corresponding to a plurality of conductive pads 1036), and a sixth key 1032 (corresponding to a plurality of conductive pads 1040).

Output 1010 is toggled between a first predetermined voltage and a second predetermined voltage. In the preferred embodiment, the first predetermined voltage is about 5-volts and the second predetermined voltage is about 0-volts. From each resistor ladder network, a unique voltage at the at least one input 1008 is generated from each key depression. Each unique voltage generated may have a value different from the first or the second predetermined voltages. For example, when output 1010 is set to 5-volts, a depression of third key 1030 may change the voltage at the at least one input 1008 to about 1.5-volts. Processor 1002 can detect each unique voltage at the at least one input 1008, and thus can detect each corresponding key actuation. Key depressions corresponding to first resistor ladder network 1050 are detectable during the first predetermined time period (since first resistor ladder network 1050 is coupled to a node 1016 biased at the second predetermined voltage) and key depressions corresponding to the second resistor ladder network 1052 are detectable during the second predetermined time period (since second resistor ladder network 1052 is coupled to a node 1018 biased at the first predetermined voltage). Preferably, each resistor of first resistor ladder network 1050 has the same resistance value as a resistor of second resistor ladder network 1052 so that processor 1002 can utilize the same key detection voltages during the first and the second predetermined time periods.

Thus, according to the present invention, a large number of keys may be detected given a relatively small number of inputs to a processor. Many conventional methods of key detection may be modified accordingly to increase the number of detectable keys or to decrease the number of inputs needed to detect a fixed number of keys.

While particular embodiments of the present invention have been shown and described, modifications may be made. It is therefore intended in the appended claims to cover all such changes and modifications which fall within the true spirit and scope of the invention.

What is claimed is:

1. A method of detecting key actuations in an electronic device, the electronic device having at least two keys and a processor, the at least two keys including a first key and a second key, the processor including at least one input, the method comprising the steps of:

(a) biasing the at least one input at a first predetermined voltage during a first predetermined time period and at a second predetermined voltage during a second predetermined time period;

(b) detecting, in response to a coupling of the at least one input to the second predetermined voltage during the first predetermined time period, an actuation of the first key; and (c) detecting, in response to a coupling of the at least one input to the first predetermined voltage during the second predetermined time period, an actuation of the second key.

2. The method of claim 1 further including the step of:

(d) establishing the first predetermined voltage at about 5-volts and the second predetermined voltage at about 0-volts.

3. The method of claim 1 further including the step of:

(g) repeating steps (a) through (c) for continuous detection of the at least two keys.

4. A method of detecting key actuations in an electronic device, the electronic device including a first plurality of keys, a second plurality of keys, and a processor, the processor having a plurality of inputs including a plurality of row inputs and a plurality of column inputs, the method comprising the steps of:

(a) biasing the plurality of inputs at a first predetermined voltage during a first predetermined time period and at a second predetermined voltage during a second predetermined time period;

(b) detecting, during the first predetermined time period and in response to a coupling of a unique combination of one row input of the plurality of row inputs and one column input of the plurality of column inputs to the second predetermined voltage, an actuation of one key of the first plurality of keys; and (c) detecting, during the second predetermined time period and in response to a coupling of a unique combination of one row input of the plurality of row inputs and one column input of the plurality of column inputs to the first predetermined voltage, an actuation of one key of the second plurality of keys.

5. The method of claim 4 wherein the steps of detecting further comprise the steps of:

(d) reading input signals at the plurality of inputs;

(e) comparing the input signals and a set of predetermined key patterns; and (f) detecting a key actuation in response to a match between the input signals and one key pattern of the set of predetermined key patterns.

6. The method of claim 4 further comprising the step of:

(g) establishing the first predetermined voltage at about 5-volts and the second predetermined voltage at about 0-volts.

7. The method of claim 4 further including the step of:

(h) repeating steps (a) through (c) for continuous detection of the first plurality of keys and the second plurality of keys.

8. A method of detecting key actuations in an electronic device, said electronic device having a processor including at least one input, said method comprising the steps of:

(a) biasing the at least one input at a first predetermined voltage during a first predetermined time period and at a second predetermined voltage during a second predetermined time period;

(b) generating, during the first predetermined time period and in response to a coupling of the at least one input to the second predetermined voltage through at least a first resistor, a third predetermined voltage having a value different from the first predetermined voltage;

(c) generating, during the second predetermined time period and in response to a coupling of the at least one input to the first predetermined voltage through at least a second resistor, a fourth predetermined voltage at the at least one input, a fourth predetermined voltage having a value different from the second predetermined voltage;

(d) detecting the third predetermined voltage at the at least one input during the first predetermined time period; and (e) detecting the fourth predetermined voltage at the at least one input during the second predetermined time period.

9. The method of claim 8 wherein the step of generating a third predetermined voltage includes the step of generating a third predetermined voltage which is about equal to the second predetermined voltage, and wherein the step of generating a fourth predetermined voltage includes the step of generating a fourth predetermined voltage which is about equal to the first predetermined voltage.

10. A method of detecting key actuations in an electronic device, the electronic device including a processor and a plurality of keys, the processor having a plurality of inputs and an output, the output coupled to and biasing the plurality of inputs, the plurality of keys including a first plurality of keys and a second plurality of keys, the method comprising the steps of:

(a) setting the output to a first predetermined voltage during a first predetermined time period, thereby biasing the plurality of inputs at the first predetermined voltage during the first predetermined time period;

(b) toggling, in response to an actuation of each key of the first plurality of keys, a unique combination of the plurality of inputs to a second predetermined voltage during the first predetermined time period;

(c) reading the plurality of inputs during the first predetermined time period;

(d) comparing the plurality of inputs and a set of predetermined key patterns during the first predetermined time period;

(e) detecting, in response to a match between the plurality of inputs and one key pattern of the set of predetermined key patterns, an actuation of one key of the first plurality of keys during the first predetermined time period;

(f) setting the output at the second predetermined voltage during a second predetermined time period, thereby biasing the plurality of inputs at the second predetermined voltage during the second predetermined time period;

(g) toggling, in response to an actuation of each key of the second plurality of keys, a unique combination of the plurality of inputs to the first predetermined voltage during the second predetermined time period;

(h) reading the plurality of inputs during the second predetermined time period;

(i) comparing the plurality of inputs and the set of predetermined key patterns during the second predetermined time period; and (j) detecting, in response to a match between the plurality of inputs and one key pattern of the set of predetermined key patterns, an actuation of one key of the second plurality of keys during the second predetermined time period.

11. The method of claim 10 further including the step of:

(k) establishing the first predetermined voltage at about 0-volts and the second predetermined voltage at about 5-volts.

12. The method of claim 10 further including the step of:

(l) repeating steps (a) through (j) for continuous detection of the first plurality of keys and the second plurality of keys.

13. An apparatus for detecting key actuations, the apparatus comprising:

a printed circuit board (PCB), said PCB including a first plurality of contact regions and a second plurality of contact regions, each contact region of said first plurality of contact regions including a first conductive pad, a second conductive pad, and a third conductive pad, each contact region of said second plurality of contact regions including a fourth conductive pad, a fifth conductive pad, and a sixth conductive pad, each said first conductive pad coupled to a first predetermined voltage through a first resistor, each said third conductive pad coupled to a second predetermined voltage through a second resistor;

a keypad, said keypad including a first plurality of keys and a second plurality of keys, each key of said first plurality of keys corresponding to one contact region of said first plurality of contact regions, each key of said second plurality of keys corresponding to one contact region of said second plurality of contact regions; and a processor, said processor including a plurality of inputs and an output, each said second conductive pad and each said third conductive pad coupled to a unique combination of two inputs of said plurality of inputs, each fifth conductive pad and each sixth conductive pad coupled to a unique combination of two inputs of said plurality of inputs, said output coupled to each input of said plurality of inputs through a plurality of resistors, said processor biasing said output at the first predetermined voltage for detecting actuations of said second plurality of keys and at the second predetermined voltage for detecting actuations of said first plurality of keys.

14. The apparatus of claim 13 wherein each key of said first plurality of keys, upon actuation, electrically couples together a corresponding first conductive pad, a corresponding second conductive pad, and a corresponding third conductive pad, and wherein each key of said second plurality of keys, upon actuation, electrically couples together a corresponding fourth conductive pad, a corresponding fifth conductive pad, and a corresponding sixth conductive pad upon actuation.

15. The apparatus of claim 13 wherein the processor further includes:

a memory for storing a set of predetermined key patterns, said set of predetermined key patterns for comparing to said plurality of inputs for detecting key actuations.

16. An electronic device comprising:

a printed circuit board (PCB), said PCB including:

a first plurality of contact regions, each contact region of said first plurality of contact regions including a first conductive pad, a second conductive pad, and a third conductive pad, each said first conductive pad coupled to a first predetermined voltage;

a second plurality of contact regions, each contact region of said second plurality of contact regions including a fourth conductive pad, a fifth conductive pad, and a sixth conductive pad, each said fourth conductive pad coupled to a second predetermined voltage;

a keypad disposed adjacent to said PCB, said keypad including:

a first plurality of keys, each key of said first plurality of keys corresponding to one contact region of said first plurality of contact regions and electrically coupling corresponding said first, second, and third conductive pads when actuated;

a second plurality of keys, each key of said second plurality of keys corresponding to one contact region of said second plurality of contact regions and electrically coupling corresponding said fourth, fifth, and sixth conductive pads when actuated; and a processor, said processor including a plurality of inputs and an output, each said second conductive pad and each said third conductive pad being coupled to a unique combination of two inputs of said plurality of inputs, each said fifth conductive pad and each said sixth conductive pad being coupled to the unique combination of two inputs of said plurality of inputs, said plurality of inputs being coupled to and voltage biased by said output, said processor setting said output to the first predetermined voltage for reading and detecting actuations of said second plurality of keys, said processor setting said output to the second predetermined voltage for reading and detecting actuations of said first plurality of keys.

17. The electronic device of claim 16 wherein said electronic device comprises a communication device.

18. The electronic device of claim 16 wherein the first predetermined voltage is about 0-volts and the second predetermined voltage is about 5-volts.

* * * * *